United States Patent
Lim et al.

(10) Patent No.: US 9,570,143 B2
(45) Date of Patent: Feb. 14, 2017

(54) SEMICONDUCTOR MEMORY DEVICE FOR PERFORMING REFRESH OPERATION

(71) Applicant: SK hynix Inc., Gyeonggi-do (KR)

(72) Inventors: Yu-Ri Lim, Gyeonggi-do (KR); Jung-Hoon Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/887,931

(22) Filed: Oct. 20, 2015

(65) Prior Publication Data

US 2016/0329089 A1    Nov. 10, 2016

(30) Foreign Application Priority Data

May 8, 2015    (KR) ........................ 10-2015-0064271

(51) Int. Cl.
  *G11C 11/406*    (2006.01)
  *G11C 11/408*    (2006.01)

(52) U.S. Cl.
  CPC ............ *G11C 11/406* (2013.01); *G11C 11/408* (2013.01); *G11C 11/4085* (2013.01)

(58) Field of Classification Search
  CPC ... G11C 11/406; G11C 11/408; G11C 11/4085
  USPC .......................................................... 365/222
  See application file for complete search history.

(56) References Cited

U.S. PATENT DOCUMENTS

2016/0055896 A1*    2/2016    Lim ..................... G11C 11/408
                                                               365/149

FOREIGN PATENT DOCUMENTS

KR    1020140139849    12/2014

\* cited by examiner

*Primary Examiner* — Han Yang
*Assistant Examiner* — Xiaochun L Chen
(74) *Attorney, Agent, or Firm* — IP & T Group LLP

(57) ABSTRACT

A semiconductor memory device includes: a plurality of memory areas; a target area setting unit suitable for designating a target area according to a number of accesses to the respective memory areas; a random address generation unit suitable for generating a random address within the respective memory areas in a random manner; a target address generation unit suitable for generating a target address based on the target area and the random address; and a driving unit suitable for performing a smart refresh operation according to the target address.

20 Claims, 3 Drawing Sheets

SEMICONDUCTOR MEMORY DEVICE FOR PERFORMING REFRESH OPERATION

CROSS-REFERENCE TO RELATED APPLICATIONS

The present application claims priority of Korean Patent Application No. 10-2015-0064271 filed on May 8, 2015, which is incorporated herein by reference in its entirety.

BACKGROUND

1. Field

This patent document relates to a semiconductor design technology, and more particularly, to a semiconductor memory device which performs a refresh operation.

2. Description of the Related Art

In general, semiconductor memory devices such as DRAM include a plurality of memory banks for storing data, and each of the memory banks includes a large number of memory cells. Each of the memory cells includes a cell transistor serving as a switch and a cell capacitor for storing data. Since current leakage occurs due to the structure of the memory cell, such as in the PN junction of the cell transistor, the data stored in the cell capacitor may be lost. Thus, semiconductor memory devices require refresh operations for recharging the memory cells before their data is lost (hereafter, referred to as 'normal refresh operation').

The normal refresh operation may include an auto refresh operation and a self refresh operation. The auto refresh operation refers to a mode in which the semiconductor device performs a refresh operation according to a refresh command applied from outside, and the self refresh operation refers to a mode in which the semiconductor device performs a refresh operation while sequentially changing an internal address according to a refresh command applied from outside.

Recently, in addition to the normal refresh operation, semiconductor devices have incorporated additional refresh operations on memory cells of a specific word line that is likely to lose its data due to row hammering. This operation is typically referred to as a target-row refresh (TRR) operation or a smart refresh (SR) operation.

SUMMARY

Various embodiments are directed to a semiconductor memory device capable of performing a refresh operation within a target area which is frequently accessed among a plurality of areas.

In an embodiment, a semiconductor memory device may include: a plurality of memory areas; a target area setting unit suitable for designating a target area according to a number of accesses to the respective memory areas; a random address generation unit suitable for generating a random address within the respective memory areas in a random manner; a target address generation unit suitable for generating a target address based on the target area and the random address; and a driving unit suitable for performing a smart refresh operation according to the target address.

The target area setting unit may include: a counter suitable for outputting a plurality of counting signals, by respectively counting first row addresses in row addresses for the plurality of memory areas which is inputted during an active operation; a detector suitable for outputting a detection signal by detecting one of the plurality of counting signals, a value of which reaches a predetermined number; i o and a target area address latch suitable for latching one among the first row addresses corresponding to the detection signal.

The random address generation unit may generate a second row address representing an address within the respective memory areas in the random manner, and outputs the second row address as the random address.

The target address generation unit may generate the target address by concatenating the latched first row address and the second row address.

Each of the memory areas may be a unit bank including a plurality of word lines.

The plurality of memory areas may correspond to one unit bank.

In an embodiment, a semiconductor memory device may include: a plurality of memory areas; a smart refresh control unit suitable for setting a target area among the plurality of memory areas, and generating a target address for a smart refresh operation to the target area; a refresh counting unit suitable for generating a normal refresh address for a normal refresh operation by counting a refresh command; a selection unit suitable for outputting one of the target address and the normal refresh address as a final refresh address according to a smart refresh enable signal enabled in response to the refresh command; and a driving unit suitable for performing one of the smart refresh operation and the normal refresh operation according to the final refresh address.

The smart refresh control unit may include: a target area setting unit suitable for designating the target area according to a number of accesses to the respective memory areas; a random address generation unit suitable for generating a random address within the respective memory areas in a random manner; and a target address generation unit suitable for generating a target address based on the target area and the random address.

The target area generation unit may include: a counter suitable for outputting a plurality of counting signals, by respectively counting first row addresses in row addresses for the plurality of memory areas which is inputted during an active operation; a detector suitable for outputting a detection signal by detecting one of the plurality of counting signals, a value of which reaches a predetermined number; and a target area address latch suitable for latching one among the first row addresses corresponding to the detection signal.

The random address generation unit may generate a second row address representing an address within the respective memory areas in the random manner, and outputs the second row address as the random address.

The target address generation unit may generate the target address by concatenating the latched first row address and the second row address.

Each of the memory areas may be a unit bank including a plurality of word lines.

The plurality of memory areas may correspond to one unit bank.

In an embodiment, an operation method of a semiconductor memory device including a plurality of memory areas may include: setting a first part of a target address according to a number of accesses to the respective memory areas; setting a second part of the target address in a random manner; and performing a smart refresh operation according to the target address.

The setting of the first part of the target address may include: outputting a plurality of counting signals, by respectively counting first row addresses in row addresses for the plurality of memory areas which is inputted during an active operation; outputting a detection signal by detecting one of the plurality of counting signals, a value of which reaches a predetermined number; and latching one as the first part among the first row addresses corresponding to the detection signal.

The second part may represent an address within the respective memory areas.

The operation method may further include: generating a normal refresh address for a normal refresh operation in response to a refresh command; and selectively outputting the target address or the normal refresh address according to a smart refresh enable signal enabled in response to the refresh command.

Each of the memory areas may be a memory cell array area including a plurality of word lines.

Each of the memory areas may be a memory bank.

In an embodiment, an operation method of a semiconductor memory device including a plurality of memory areas may include: designating a target area according to a number of accesses to the respective memory areas; generating a random address within the respective memory areas in a random manner; generating a target address based on the target area and the random address; and performing a smart refresh operation according to the target address.

DETAILED DESCRIPTION

Figure 1:
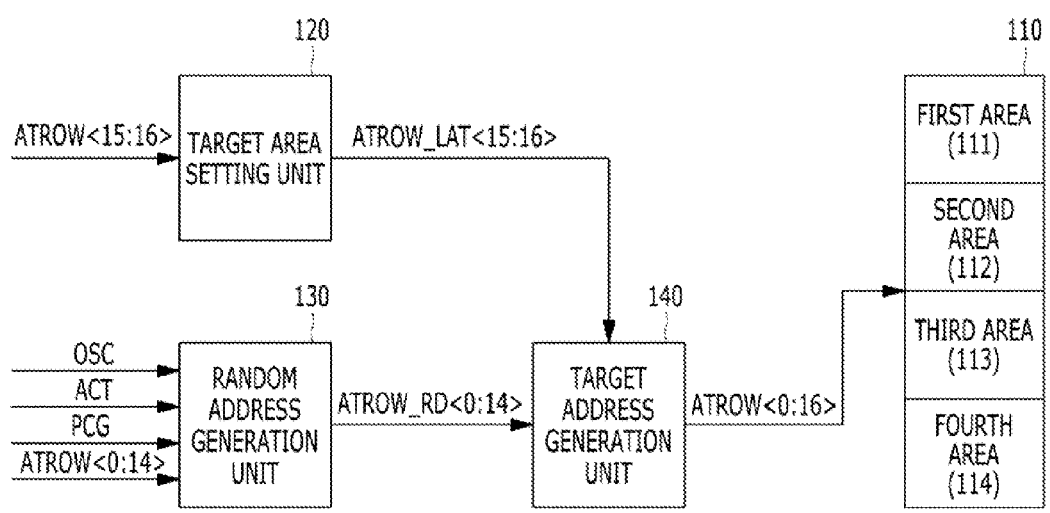
FIG. 1 is a configuration diagram illustrating a semiconductor memory device in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a configuration diagram of a semiconductor memory device in accordance with an embodiment of the present invention, Referring to FIG. 1, the semiconductor memory device may include a memory area 110 including first to fourth areas 111 to 114, a target area setting unit 120, a random address generation unit 130, and a target address generation unit 140. Although not shown, the semiconductor memory device may further include a word line driving unit.

The first to fourth areas 111 to 114 of the memory area 110 may be identified by the most significant two-bit row address ATROW<15:16> in a row address ATROW<0:16>. The most significant two-bit row address ATROW<15:16> will be hereafter referred to as first row address. The rest of the row address ATROW<0:16> or the row address <0:14> will be hereafter referred to as a second row address. Each of the first to fourth areas 111 to 114 may correspond to a memory cell array area including a plurality of word lines or a memory bank area including a plurality of memory cell arrays, that is, a unit bank.

The target area setting unit 120 may set a target area among the first to fourth areas 111 to 114 based on access numbers of each of the first to fourth areas 111 to 114. Through a decoding and counting operation to the first row address ATROW<15:16>, the target area setting unit 120 may output a first row address ATROW_LAT<15:16> corresponding to the target area which is accessed a predetermined number of times (for example, $2^N$ times) or more among the first to fourth areas 111 to 114. The target area setting unit 120 will be described in more detail with reference to FIG. 2.

The random address generation unit 130 may predict one ATROW_RD<0:14> among the second row address ATROW<0:14> to which an active command ACT is likely to be enabled during an active period of a periodic signal OSC. The second row address ATROW_RD<0:14> will be hereafter also referred to as a random address. In other words, the random address generation unit 130 may output one among the second row address ATROW<0:14>, which is likely to be accessed, as the random address ATROW_RD<0:14>.

The target address generation unit 140 may output a target address ATROW_SR<0:16> for a smart refresh operation to the target area in response to the row address ATROW_LAT<15:16> outputted from the target area setting unit 120 and the random address ATROW_RD<0:14> outputted from the random address generation unit 130. The target address ATROW_SR<0:16> may indicate a word line selected by the randomly generated random address ATROW_RD<0:14> within the target area which is the most frequently accessed among the first to fourth areas 111 to 114.

The target address ATROW_SR<0:16> may indicate an address adjacent to a randomly generated address within the target area. In other words, the target address ATROW_SR<0:16> may correspond to a word line adjacent to a target word line of the randomly generated address within the target area. For example, when the target word line is an Nth word line, the target address ATROW_SR<0:16> may correspond to one or more of (N+1)th and (N−1)th word lines.

The adjacency of the target word line may vary according to memory design. For example, when the target word line is an Nth word line, the target address ATROW_SR<0:16> may correspond to one or more between (N+n)th and (N−n)th adjacent word lines.

The word line driving unit (not shown) may perform the refresh operation by driving one or more adjacent word lines corresponding to the target address ATROW_SR<0:16>.

The operation of the semiconductor memory device in accordance with the embodiment of the present invention will be described in detail with reference to FIG. 2.

Figure 2:
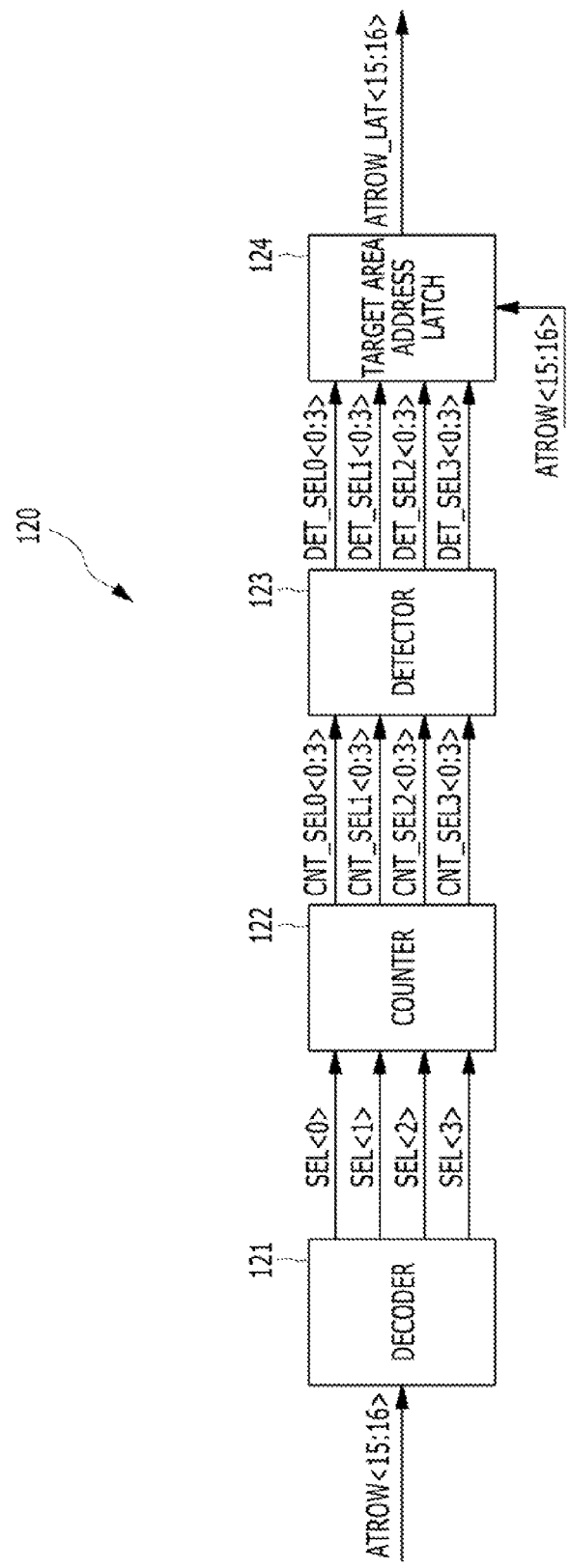
FIG. 2 is a configuration diagram illustrating a target area setting unit illustrated in FIG. 1.

FIG. 2 is a configuration diagram illustrating the target area setting unit 120 described with reference to FIG. 1.

Referring to FIGS. 1 and 2, the target area setting unit 120 may include a decoder 121, a counter 122, a detector 123, and a target area address latch 124.

The decoder 121 may generate a plurality of decoding signals SEL<0> to SEL<3> by decoding the first row address ATROW<15:16>. The first row address ATROW<15:16> may be inputted to the decoder 121 whenever an active command ACT is enabled. For example, the decoder 121 may decode the first row address ATROW<15:16> and may enable the first to fourth decoding signals SEL<0> to SEL<3> when the first row address ATROW<15:16> is <0:0>, <0:1>, <1:0>, and <1:1>, respectively The counter 122 may output a plurality of counting signals CNT_SEL0<0:3> to CNT_SEL3<0:3> by counting the plurality of decoding signals SEL<0> to SEL<3> outputted from the decoder 121, respectively. The counter 122 may include a plurality of counting circuits (not illustrated) for counting the plurality of decoding signals SEL<0> to SEL<4>, respectively.

The detector 123 may output detection signals DET_SEL0 to DEET_SEL3 respectively corresponding to the plurality of counting signals CNT_SEL0<0:3> to CNT_SEL3<0:3> when the respective counting signals CNT_SEL0<0:3> to CNT SEL3<0:3> are inputted a predetermined number of times or more. For example, the detector 123 may output the first detection signal DET_SEL0 among the plurality of detection signals DET_SEL0 to DET_SEL3 when the first counting signal CNT_SEL0<0:3> among the plurality of counting signals CNT_SEL0<0:3> to CNT SEL3<0:3> is inputted $2^N$ times or more. The detector 123 may include a plurality of detection circuits (not illustrated) for detecting the plurality of counting signals DET_SEL0 to DET_SEL3, respectively.

The target area address latch 124 may latch the first row address ATROW<15:16> corresponding to the enabled one among the plurality of detection signals DET_SEL0 to DET_SEL3.

Hereafter, the operation of the semiconductor memory device including the target area setting unit 120 will be described as follows.

An example in which the active command ACT is continuously inputted six times will be presented. For example, suppose that the first row address ATROW<15:16> having the values of <0:0>, <0:1>, <0:0>, <1:0>, <0:0>, and <0:0> is sequentially inputted whenever the active command ACT is enabled. In this case, the first counting signal CNT_SEL0<0:3> corresponding to the first decoding signal SEL<0> may be enabled four times by the counter 122, and each of the second counting signal CNT_SEL1<0:3> corresponding to the second decoding signal SEL<1> and the third counting signal CNT_SEL2<0:3> corresponding to the third decoding signal SEL<2> may be enabled once.

Then, the detector 123 may detect one of the plurality of counting signals CNT_SEL0<0:3> to CNT_SEL3<0:3>, the enablement of which reaches the predetermined number of times, and output a corresponding one of the detection signals DET_SEL0<0:3> to DET_SEL3<0:3>. For example, when the enablement of the first counting signal CNT_SEL0<0:3> reaches a predetermined number of times, for example, $2^N$ times, the detector 123 may output the first detection signal DEL_SEL0<0:3> corresponding to the first counting signal CNT_SEL0<0:3>.

Thus, the target area address latch 124 may output the first row address ATROW_LAT<15:16> corresponding to the first detection signal DET_SEL0<0:3>.

Referring back to FIG. 1, the random address generation unit 130 may generate the random address ATROW_RD<0:14> as a row address which is likely to be accessed among the second row address ATROW<0:14>.

Then, the target address generation unit 140 may generate the target address ATROW_SR<0:16> for the target area based on the first row address ATROW_LAT<15:16> corresponding to the target area and the random address ATROW_RD<0:14>.

In short, the semiconductor memory device in accordance with the embodiment of the present invention may randomly set the target address within the target area instead of setting the target address within the entire memory area 110. Thus, the semiconductor memory device may increase the probability of a smart refresh, thereby preventing cell deterioration.

Figure 3:
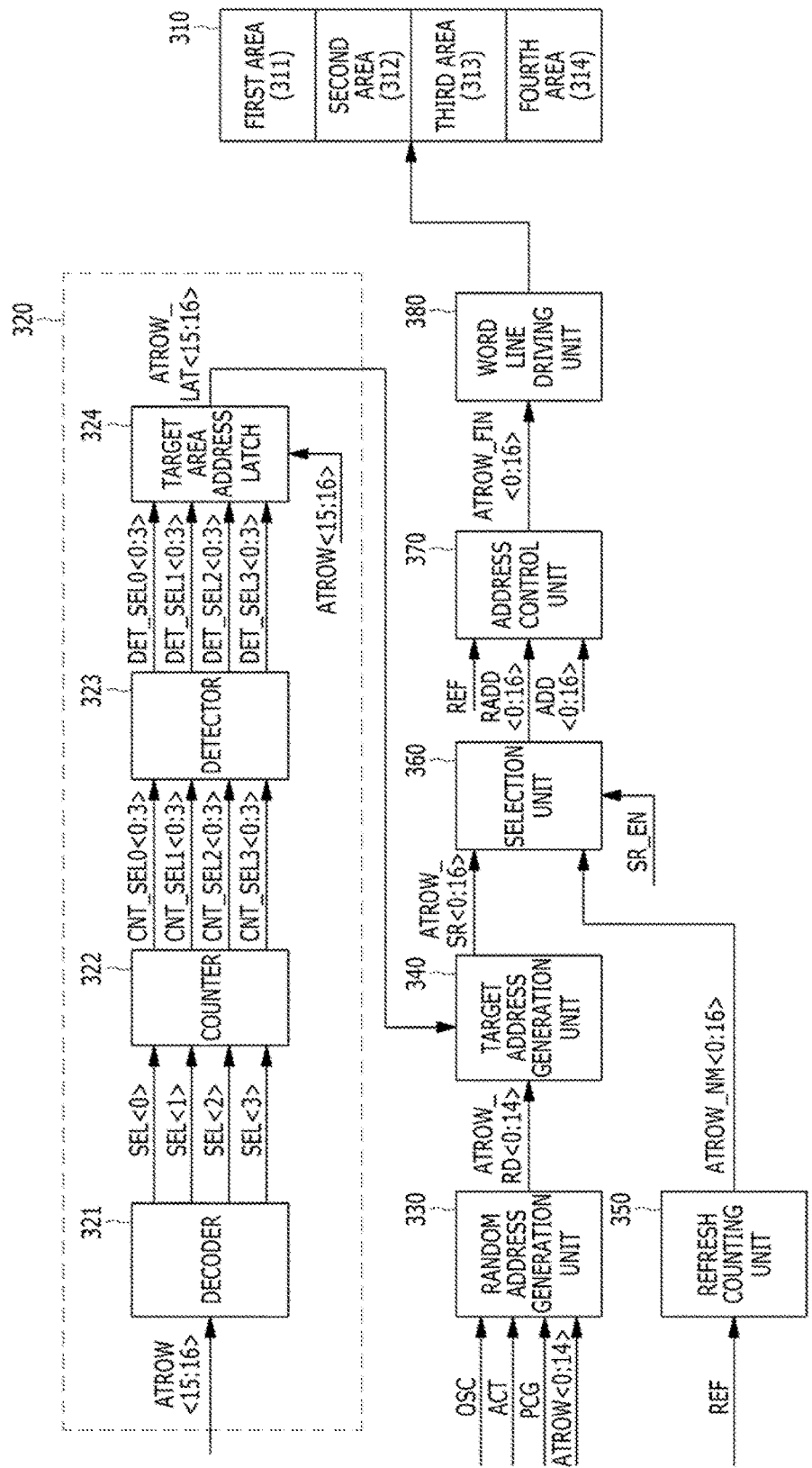
FIG. 3 is a configuration diagram illustrating a semiconductor memory device in accordance with another embodiment of the present invention.

FIG. 3 is a configuration diagram illustrating a semiconductor memory device in accordance with another embodiment of the present invention.

Referring to FIG. 3, the semiconductor memory device may include a memory area 310 including first to fourth areas 311 to 314, a target area setting unit 320, a random address generation unit 330, a target address generation unit 340, a refresh counting unit 350, a selection unit 360, an address control unit 370, and a word line driving unit 380.

Since the memory area 3 0, the target area setting unit 320, the random address generation unit 330, and the target address generation unit 340 are configured and operated in the same manner as the memory area 110, the target area setting unit 120, the random address generation unit 130 and the target address generation unit 140 which are illustrated in FIG. 1, detailed descriptions thereof are omitted.

The refresh counting unit 350 may generate a normal refresh address ATROW_NM<0:16> for performing a normal refresh operation in response to a plurality of row address ATROW<0:16>.

The selection unit 360 may output the smart refresh address ATROW_SR<0:16> outputted from the target address generation unit 340 or the normal refresh address ATROW_NM<0 16> outputted from the refresh counting unit 350 as a refresh address RADD<0:16> for a refresh operation in response to a smart refresh enable signal SR_EN. The smart refresh enable signal SR_EN may be enabled in response to a refresh command REF inputted from outside.

The address control unit 370 may output the refresh address RADD<0:16> outputted from the selection unit 360 or a normal address ADD<0:16> as a final address ATROW_FIN<0:16> in response to the refresh command REF. When the refresh command REF for a refresh operation is inputted, the refresh address RADD<0:16> may be outputted as the final address ATROW_FIN<0:16>, and when the refresh command REF is not inputted, the normal address ADD<0:16> for a normal operation may be outputted as the final address ATROW_FIN<0:16>.

The word line driving unit 380 may drive a word line corresponding to the final address ATROW_FIN<0:16> in response to the final address ATROW_FIN<0:16>.

Hereafter, the operation of the semiconductor memory device in accordance with the embodiment of the present invention will be described as follows.

When a smart refresh operation is performed, the target address generation unit 340 may output the target address ATROW_SR<0:16> for the smart refresh operation in response to the first row address ATROW_LAT<15:16> outputted from the target area setting unit 320 and corresponding to a target area among the first to fourth areas 311 to 314 and the random address ATROW_RD<0:14> outputted from the random address generation unit 330. Then, the selection unit 360 and the address control unit 370 may transmit the target address ATROW_SR<0:16> as the final address ATROW_FIN<0:16> to the word line driving unit 380 in response to the smart refresh enable signal SR_EN and the refresh command REF, respectively. Thus, a word line corresponding to the target address ATROW_SR<0:16> within the target area among the first to fourth areas 311 to 314 may be activated to perform a refresh operation.

When a normal refresh operation is performed, the refresh counting unit 350 may sequentially generate a normal refresh address ATROW_NM<0:16> for the normal refresh operation in response to the plurality of row address ATROW<0:16>. Then, the selection unit 360 and the address control unit 370 may transmit the normal refresh address ATROW_NM<0:16> as the final address ATROW_FIN<0:16> to the word line driving unit 380 in response to the smart refresh enable signal SR_EN and the refresh command REF, respectively. Thus, a word line corresponding to the final address ATROW_FIN<0:16> which is sequentially activated in the memory area 310 may be activated to perform a refresh operation.

When normal operations other than the refresh operation are performed, the address control unit 370 may transmit a normal address ADD for performing a normal operation as the final address ATROW_FIN<0 16> to the word line driving unit, as commands (not illustrated) other than the refresh command REF are inputted. Then, the word line driving unit 380 may activate a word line corresponding to the final address ATROW_FIN<0:16> and perform the corresponding operation.

In short, the semiconductor memory device in accordance with the embodiment of the present invention may generate the target address ATROW_SR<0:16> in the area which is the most frequently accessed, among the first to fourth areas 311 to 413. Thus, the semiconductor memory device may increase the probability of a smart refresh, thereby preventing cell deterioration.

For this operation, the semiconductor memory device accordance with the embodiment of the present invention may perform an operation according to the following method.

The operation method of a semiconductor memory device including a plurality of memory areas may include: setting a first part of a target address according to a number of accesses to the respective memory areas; setting a second part of the target address in a random manner; and performing a smart refresh operation according to the target address.

Also, the operation method of a semiconductor memory device including a plurality of memory areas may include: designating a target area according to a number of accesses to the respective memory areas; generating a random address within the respective memory areas in a random manner; generating a target address based on the target area and the random address; and performing a smart refresh operation according to the target address.

Although various embodiments have been described for illustrative purposes, it will be apparent to those skilled in the art that various changes and modifications may be made without departing from the spirit and scope of the invention as defined in the following claims.

What is claimed is:

1. A semiconductor memory device comprising:
a plurality of memory areas;
a target area setting unit suitable for designating a target area according to a number of accesses to the respective memory areas;
a random address generation unit suitable for generating a random address within the respective memory areas in a random manner;
a target address generation unit suitable for generating a target address based on the target area and the random address; and
a driving unit suitable for performing a smart refresh operation according to the target address.

2. The semiconductor memory device of claim 1, wherein the target area setting unit comprises:
a counter suitable for outputting a plurality of counting signals, by respectively counting first row addresses in row addresses for the plurality of memory areas which is inputted during an active operation;
a detector suitable for outputting a detection signal by detecting one of the plurality of counting signals, a value of which reaches a predetermined number; and
a target area address latch suitable for latching one among the first row addresses corresponding to the detection signal.

3. The semiconductor memory device of claim 2, wherein the random address generation unit generates a second row address representing an address within the respective memory areas in the random manner, and outputs the second row address as the random address.

4. The semiconductor memory device of claim 3, wherein the target address generation unit generates the target address by concatenating the latched first row address and the second row address.

5. The semiconductor memory device of claim 1, wherein each of the memory areas is a unit bank including a plurality of word lines.

6. The semiconductor memory device of claim wherein the plurality of memory areas correspond to one unit bank.

7. A semiconductor memory device comprising.
a plurality of memory areas;
a smart refresh control unit suitable for setting a target area among the plurality of memory areas, and generating a target address for a smart refresh operation to the target area;
a refresh counting unit suitable for generating a normal refresh address for a normal refresh operation by counting a refresh command;
a selection unit suitable for outputting one of the target address and the normal refresh address as a final refresh address according to a smart refresh enable signal enabled in response to the refresh command; and
a driving unit suitable for performing one of the smart refresh operation and the normal refresh operation according to the final refresh address.

8. The semiconductor memory device of claim 7, wherein the smart refresh control unit comprises:
a target area setting unit suitable for designating the target area according to a number of accesses to the respective memory areas;
a random address generation unit suitable for generating a random address within the respective memory areas in a random manner; and
a target address generation unit suitable for generating a target address based on the target area and the random address.

9. The semiconductor memory device of claim 8, wherein the target area generation unit comprises:
a counter suitable for outputting a plurality of counting signals, by respectively counting first row addresses in row addresses for the plurality of memory areas which is inputted during an active operation;
a detector suitable for outputting a detection signal by detecting one of the plurality of counting signals, a value of which reaches a predetermined number; and
a target area address latch suitable for latching one among the first row addresses corresponding to the detection signal.

10. The semiconductor memory device of claim 9, wherein the random address generation unit generates a second row address representing an address within the respective memory areas in the random manner, and outputs the second row address as the random address.

11. The semiconductor memory device of claim 10, wherein the target address generation unit generates the target address by concatenating the latched first row address and the second row address.

12. The semiconductor memory device of claim 7, wherein each of the memory areas is a unit bank including a plurality of word lines.

13. The semiconductor memory device of claim 7, wherein the plurality of memory areas correspond to one unit bank.

14. An operation method of a semiconductor memory device including a plurality of memory areas, the method comprising:
    setting a first part of a target address according to a number of accesses to the respective memory areas;
    setting a second part of the target address in a random manner; and
    performing a smart refresh operation according to the target address.

15. The operation method of claim 14, wherein the setting of the first part of the target address comprises:
    outputting a plurality of counting signals, by respectively counting first row addresses in row addresses for the plurality of memory areas which is inputted during an active operation;
    outputting a detection signal' by detecting one of the plurality of counting signals, a value of which reaches a predetermined number; and
    latching one as the first part, among the first row addresses corresponding to the detection signal.

16. The operation method of claim 15, wherein the second part represents an address within the respective memory areas.

17. The operation method of claim 15, further comprising:
    generating a normal refresh address for a normal refresh operation in response to a refresh command; and
    selectively outputting the target address or the normal refresh address according to a smart refresh enable signal enabled in response to the refresh command.

18. The operation method of claim 14, wherein each of the memory areas is a memory cell array area including a plurality of word lines.

19. The operation method of claim 14, wherein each of the memory areas is a memory bank.

20. An operation method of a semiconductor memory device including a plurality of memory areas, the method comprising:
    designating a target area according to a number of accesses to the respective memory areas;
    generating a random address within the respective memory areas in a random manner;
    generating a target address based on the target area and the random address; and
    performing a smart refresh operation according to the target address.

* * * * *